United States Patent
An

(10) Patent No.: US 10,673,023 B2
(45) Date of Patent: Jun. 2, 2020

(54) DISPLAY DEVICE

(71) Applicant: LG Display Co., Ltd., Seoul (KR)

(72) Inventor: Hyunjin An, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/197,315

(22) Filed: Nov. 20, 2018

(65) Prior Publication Data

US 2019/0165316 A1    May 30, 2019

(30) Foreign Application Priority Data

Nov. 29, 2017    (KR) ........................ 10-2017-0162314

(51) Int. Cl.
| | |
|---|---|
| *H01L 51/52* | (2006.01) |
| *H01L 27/32* | (2006.01) |
| *H01L 51/56* | (2006.01) |
| *G09G 3/3225* | (2016.01) |

(52) U.S. Cl.
CPC ........ *H01L 51/5259* (2013.01); *H01L 27/322* (2013.01); *H01L 27/3213* (2013.01); *H01L 27/3246* (2013.01); *H01L 51/5284* (2013.01); *H01L 51/56* (2013.01); *G09G 3/3225* (2013.01); *G09G 2310/08* (2013.01)

(58) Field of Classification Search
CPC . H01L 51/5259; H01L 27/3213; H01L 51/56; H01L 27/3246; H01L 27/322; H01L 51/5284; G09G 2310/08; G09G 3/3225
See application file for complete search history.

(56) References Cited

U.S. PATENT DOCUMENTS

| | | | |
|---|---|---|---|
| 9,004,971 | B2 | 4/2015 | Son et al. |
| 2012/0169216 | A1 | 7/2012 | Son et al. |

FOREIGN PATENT DOCUMENTS

| | | | |
|---|---|---|---|
| JP | 2000-100558 A | | 4/2000 |
| JP | 2001-126862 A | | 5/2001 |
| JP | 2005-123089 A | | 5/2005 |
| JP | 2005123089 | * | 5/2005 |
| JP | 2011-100554 A | | 5/2011 |
| KR | 10-2012-0077403 A | | 7/2012 |

OTHER PUBLICATIONS

Extended European Search Report, European patent application No. 18208488.9, dated Apr. 29, 2019, 7 pages.

* cited by examiner

*Primary Examiner* — Kyoung Lee
(74) *Attorney, Agent, or Firm* — Fenwick & West LLP

(57) ABSTRACT

A display device is provided that can prevent degradation of an emission layer and improve reliability by removing moisture produced in an organic light-emitting display. The display device comprises: a thin-film transistor (TFT) array substrate where organic light-emitting diodes are formed; a color filter array substrate that faces the TFT array substrate and comprises a black matrix; and a getter layer that is disposed between the TFT array substrate and the color filter array substrate and comprises a getter pattern overlapping the black matrix.

11 Claims, 10 Drawing Sheets

DISPLAY DEVICE

CROSS-REFERENCE TO RELATED APPLICATIONS

This application claims the benefit of the Republic of Korea Patent Application No. 10-2017-0162314 filed on Nov. 29, 2017, which is incorporated by reference in its entirety.

BACKGROUND

Field of Technology

The present disclosure relates to a display device, and more particularly, to a display device capable of preventing a decline in reliability caused by moisture.

Related Art

With the development of the information society, various demands for display devices for displaying images are on the rise. In the field of display devices, flat panel display devices (FPDs), which are thin and light and can cover a large area, have been rapidly replacing cathode ray tubes (CRTs), which are bulky. The flat panel display devices include liquid crystal displays (LCDs), plasma display panels (PDPs), organic light-emitting displays (OLEDs), electrophoretic displays (EDs), etc.

Among these types of displays, the organic light-emitting displays are self-luminous devices, and have fast response time, high light emission efficiency, great brightness, and wide viewing angles. Notably, the organic light-emitting displays can be fabricated on a flexible plastic substrate, and have advantages over plasma display panels or inorganic light emitting displays in that they can operate at a low voltage, have lower power consumption, and deliver vivid color reproduction, as compared to plasma display panels or inorganic electroluminescence (EL) displays.

An organic light-emitting display comprises an emission layer situated between a first electrode as an anode and a second electrode as a cathode. A hole from the first electrode and an electron from the second electrode recombine within the emission layer, forming an exciton, i.e., a hole-electron pair. Then, energy is created as the exciton returns to the ground state, thereby causing the organic light-emitting display to emit light. The emission layer is made of an organic material that is susceptible to moisture, and easily degrades when exposed to moisture. In order to protect the emission layer from moisture, the organic light-emitting display comprises a getter for absorbing moisture in it. However, if the getter is opaque, it cannot be formed on a path through which light is sent out, and therefore used only on the bezel around the outer edge of the organic light-emitting display. Accordingly, the moisture produced in the organic light-emitting display cannot be removed, thus causing the emission layer to easily degrade.

SUMMARY

The present disclosure describes a display device that can prevent degradation of an emission layer and improve reliability by removing moisture produced in an organic light-emitting display.

According to an exemplary embodiment of the present disclosure, a display device comprises: a thin-film transistor (TFT) array substrate where organic light-emitting diodes are formed; a color filter array substrate that faces the TFT array substrate and comprises a black matrix; and a getter layer that is situated between the TFT array substrate and the color filter array substrate and comprises a getter pattern overlapping the black matrix.

In some embodiments, the getter layer comprises a base film, and the getter pattern disposes on the base film.

In some embodiments, the getter layer comprises a resin layer that disposes on the base film and has holes or grooves.

In some embodiments, the getter layer comprises a resin layer that disposes on the color filter array substrate and has holes or grooves.

In some embodiments, the getter pattern fills the holes or grooves.

In some embodiments, the display device further comprises an adhesive layer disposed between the getter layer and the color filter array substrate.

In some embodiments, the getter pattern is in the shape of meshes.

In some embodiments, the getter pattern is in the shape of stripes.

In some embodiments, the getter pattern has the same shape as the black matrix.

In some embodiments, the thickness of the getter layer is 1 to 100 μm.

In some embodiments, the display device further comprises a sealant for holding the color filter array substrate and the TFT array substrate together, wherein the sealant comprises a getter.

According to another exemplary embodiment of the present disclosure, a display device comprises: a TFT array substrate where organic light-emitting diodes are formed; a color filter array substrate that faces the TFT array substrate and comprises a black matrix; and a getter pattern that is disposed between the TFT array substrate and the color filter array substrate and overlaps the black matrix.

In some embodiments, the thickness of the getter layer is 1 to 100 μm.

BRIEF DESCRIPTION OF DRAWINGS

The accompany drawings, which are included to provide a further understanding of the disclosure and are incorporated on and constitute a part of this specification, illustrate embodiments of the disclosure and together with the description serve to explain the principles of the disclosure. In the drawings.

DETAILED DESCRIPTION

Figure 1:
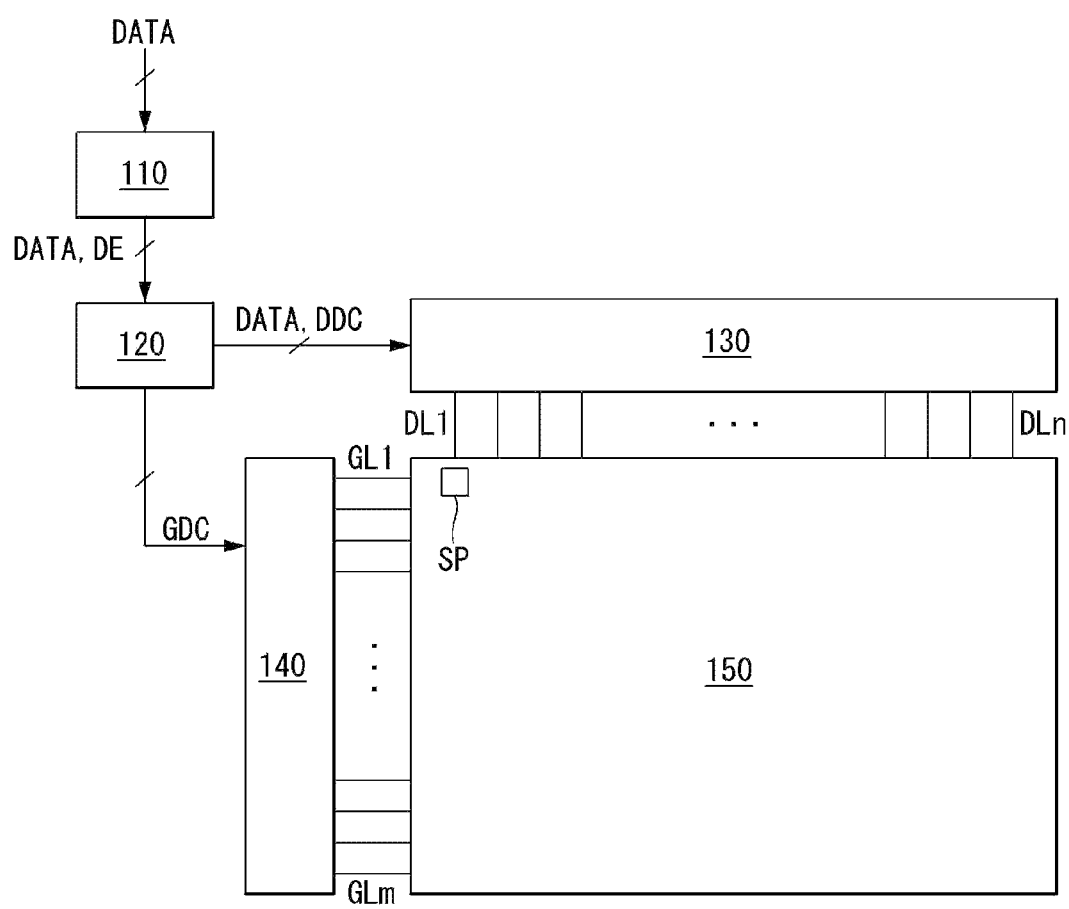
FIG. 1 is a schematic block diagram of an organic light-emitting display, according to an embodiment.

Hereinafter, exemplary embodiments of the present disclosure will be described in detail with reference to the attached drawings. Throughout the specification, like reference numerals denote substantially like components. In describing the present disclosure, a detailed description of known functions or configurations related to the present disclosure will be omitted when it is deemed that they may unnecessarily obscure the subject matter of the present disclosure. The terms and names of elements used herein are chosen for ease of description and may be different from the names of parts used in actual products. When the position relation between two parts is described using the terms "on," "over," "under," "next to" and the like, one or more parts may be positioned between the two parts as long as the term "immediately" or "directly" is not used.

A display device according to the present disclosure is a display device in which display elements are formed on a glass substrate or flexible substrate. Although examples of the display device comprise an organic light-emitting display, a liquid-crystal display, and an electrophoretic display, etc., the present disclosure will be described with respect to an organic light-emitting display. The organic light-emitting display comprises an organic layer composed of organic materials situated between a first electrode as an anode and a second electrode as a cathode. A hole from the first electrode and an electron from the second electrode recombine within the organic layer, forming an exciton, i.e., a hole-electron pair. Then, energy is created as the exciton returns to the ground state, thereby causing the self-luminous display to emit light.

Figure 2:
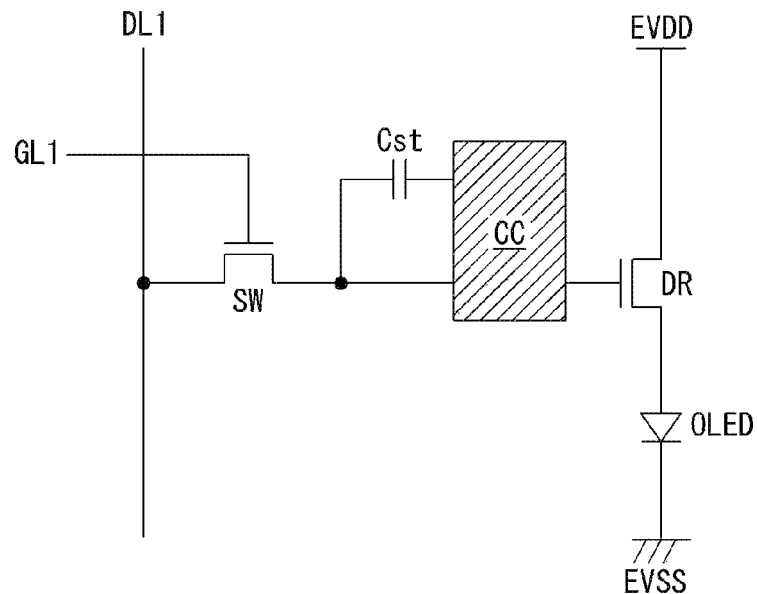
FIG. 2 is a schematic circuit diagram of a subpixel, according to an embodiment.
Figure 3:
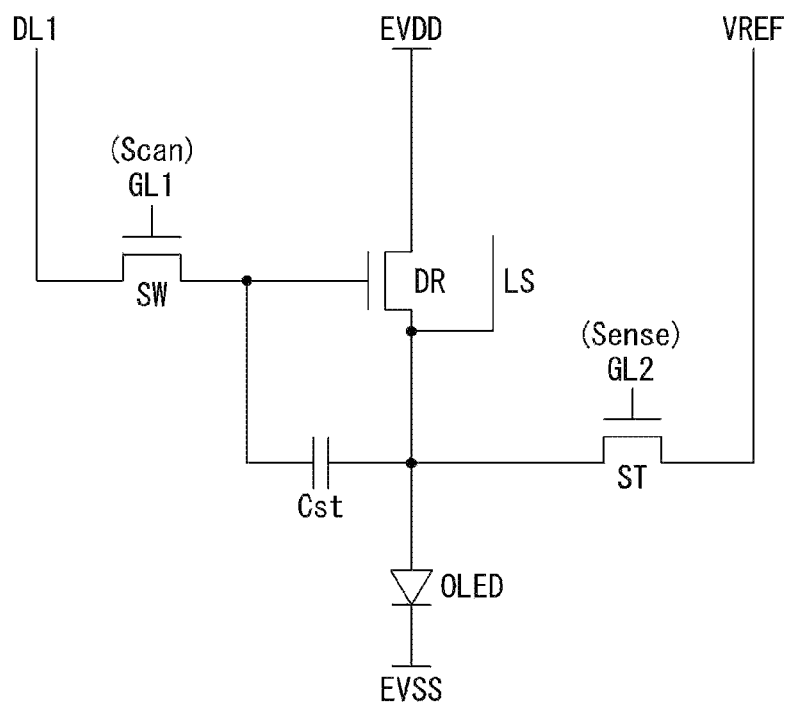
FIG. 3 is an illustration of a detailed circuit diagram of a subpixel, according to an embodiment.
Figure 4:
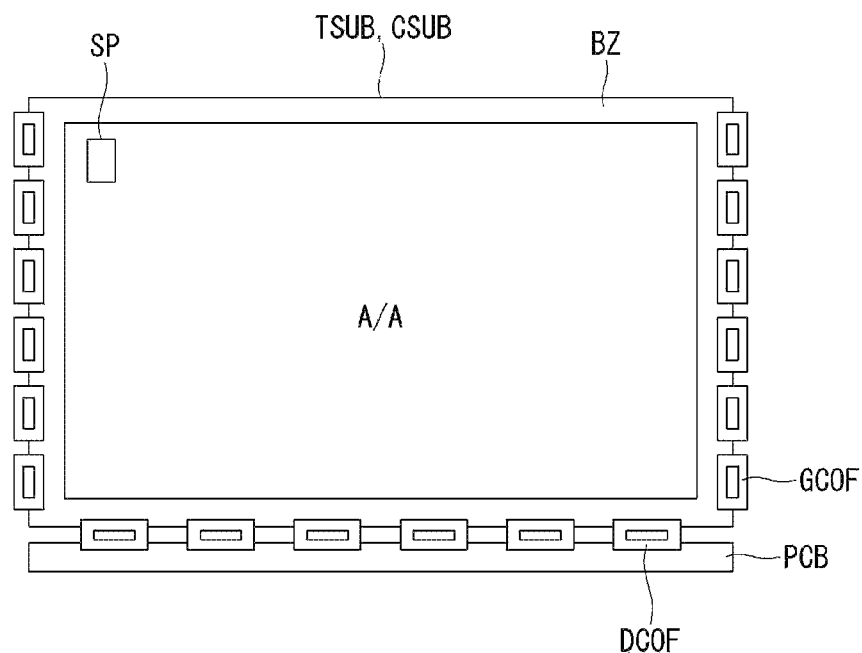
FIG. 4 is a top plan view of an organic light-emitting display, according to an embodiment.
Figure 5:
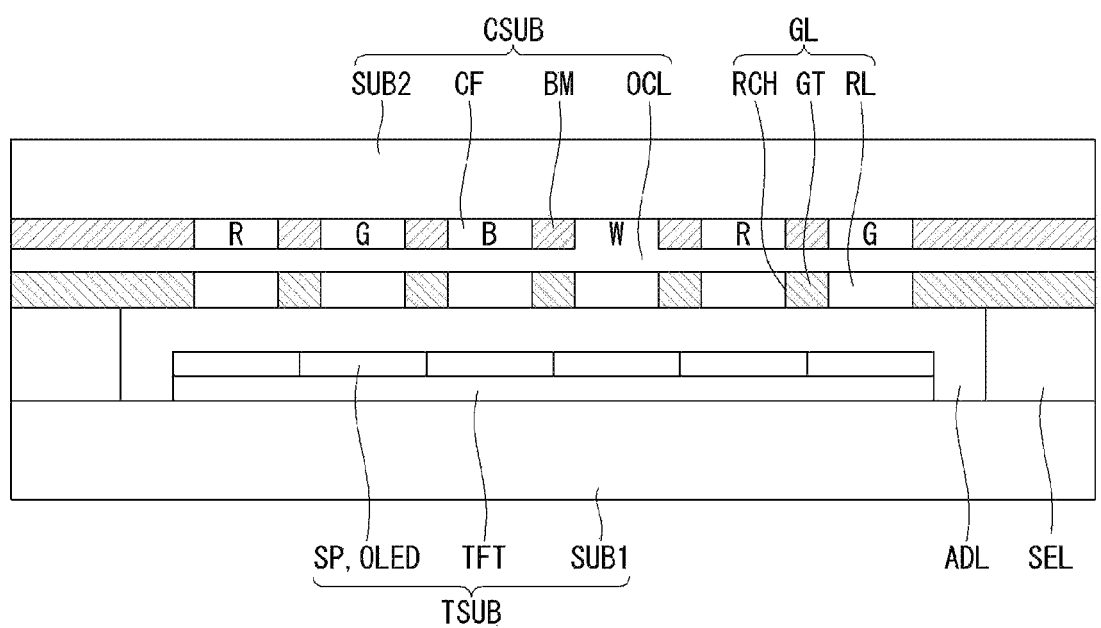
FIG. 5 is a cross-sectional view of an organic light-emitting display according to a first exemplary embodiment.
Figure 6:
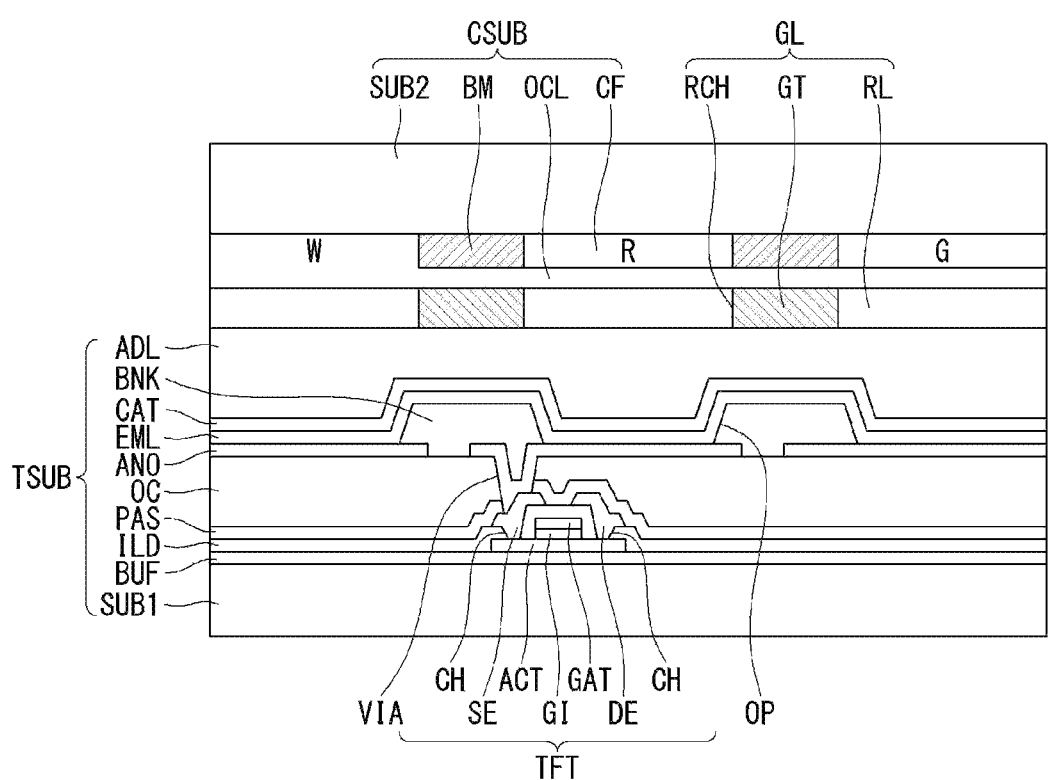
FIGS. 6 and 7 are cross-sectional views of a subpixel in the organic light-emitting display according to the first exemplary embodiment.
Figure 7:
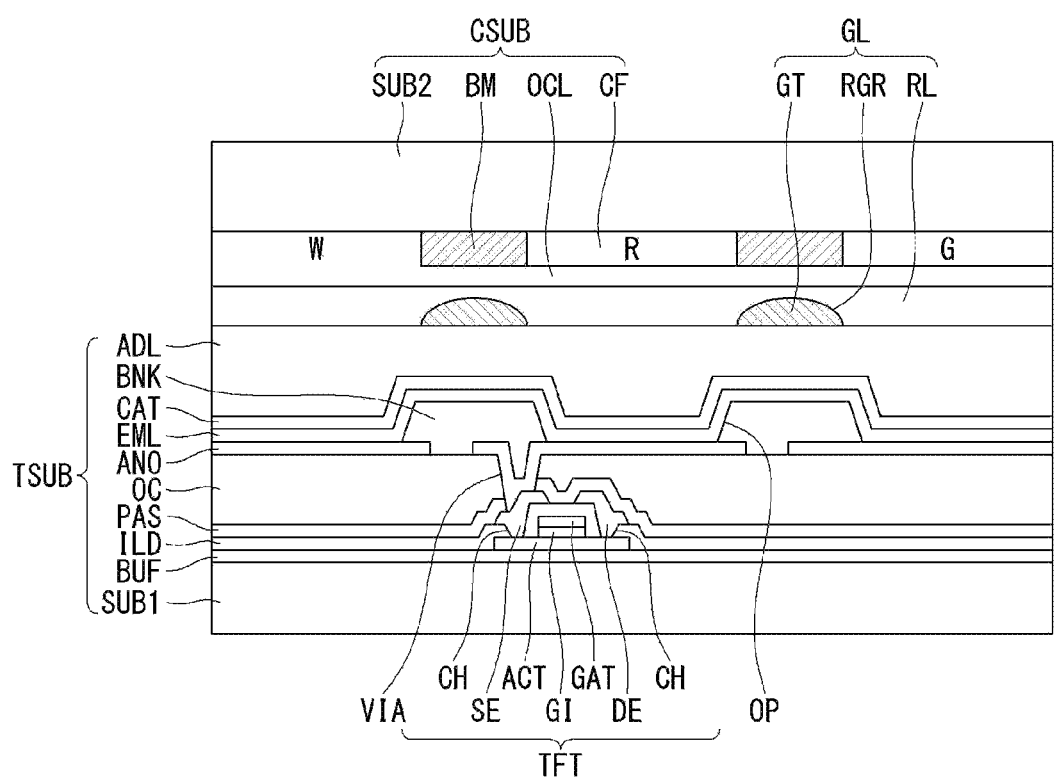

FIG. 1 is a schematic block diagram of an organic light-emitting display, according to an embodiment. FIG. 2 is a schematic circuit diagram of a subpixel, according to an embodiment. FIG. 3 is an illustration of a detailed circuit diagram of a subpixel, according to an embodiment. FIG. 4 is a top plan view of an organic light-emitting display, according to an embodiment. FIG. 5 is a cross-sectional view of an organic light-emitting display according to a first exemplary embodiment. FIGS. 6 and 7 are cross-sectional views of a subpixel in the organic light-emitting display according to the first exemplary embodiment.

Referring to FIG. 1, an organic light-emitting display comprises an image processor 110, a timing controller 120, a data driver 130, a scan driver 140, and a display panel 150.

The image processor 110 outputs a data enable signal DE, etc., along with an externally supplied data signal DATA. The image processor 110 may output one or more among a vertical synchronization signal, horizontal synchronization signal, and clock signal, in addition to the data enable signal DE, but these signals are not shown in the drawings for convenience of explanation.

The timing controller 120 receives the data signal DATA from the image processor 110, along with the data enable signal DE or driving signals including the vertical synchronization signal, horizontal synchronization signal, and clock signal. Based on the driving signals, the timing controller 120 outputs a gate timing control signal GDC for controlling the operation timing of the scan driver 140 and a timing control signal DDC for controlling the operation timing of the data driver 130.

In response to the data timing control signal DDC supplied from the timing controller 120, the data driver 130 samples and latches the data signal DATA supplied form the timing controller 120, converts it to a gamma reference voltage, and outputs the gamma reference voltage. The data driver 130 outputs the data signal DATA through data lines DL1 to DLn. The data driver 130 may be formed in the form of an IC (integrated circuit).

In response to the gate timing control signal GDC supplied from the timing controller 120, the scan driver 140 outputs a scan signal. The scan driver 140 outputs the scan signal through gate lines GL1 to GLm. The scan driver 140 is formed in the form of an IC (integrated circuit), or is formed on the display panel 150 by a gate-in-panel (GIP) technology.

The display panel 150 displays an image, corresponding to the data signal DATA and scan signal respectively supplied from the data driver 130 and scan driver 140. The display panel 150 includes subpixels SP that display an image.

The subpixels SP comprise red subpixels, green subpixels, and blue subpixels or comprise white subpixels, red subpixels, green subpixels, and blue subpixels. The subpixels SP may have one or more emission areas depending on their emission characteristics.

As shown in FIG. 2, each subpixel SP comprises a switching transistor SW, a driving transistor DR, a capacitor Cst, a compensation circuit CC, and an organic light emitting diode OLED.

In response to a scan signal supplied through the first gate line GL1, the switching transistor SW is switched on so that a data signal supplied through the first data line DL1 is stored as a data voltage in a capacitor Cst. The driving transistor DR operates so that a driving current flows between a power supply line EVDD (high-level voltage) and a cathode power supply line EVSS (low-level voltage) in response to the data voltage stored in the capacitor Cst. The organic light-emitting diode OLED operates to emit light by the driving current formed by the driving transistor DR.

The compensation circuit CC is a circuit that is added into the subpixel to compensate for the threshold voltage, etc. of the driving transistor DR. The compensation circuit CC comprises one or more transistors. The compensation circuit CC has a wide variety of configurations depending on the compensation method, so a detailed illustration and description of this will be omitted.

As shown in FIG. 3, the compensation circuit CC comprises a sensing transistor ST and a sensing line VREF (or a reference line). The sensing transistor ST is connected between a source electrode of the driving transistor DR and the anode (hereinafter, sensing node) of the organic light-emitting diode OLED. The sensing transistor ST operates to supply a reset voltage (or sensing voltage) delivered through the sensing line VREF to the sensing node of the driving transistor DR or to sense a voltage or current at the source node of the driving transistor DR or at the sensing line VREF.

A first electrode of the switching transistor SW is connected to the first data line DL1, and a second electrode of the switching transistor SW is connected to a gate electrode of the driving transistor DR. A first electrode of the driving transistor DR is connected to the power supply line EVDD, and a second electrode of the driving transistor DR is connected to the anode of the organic light-emitting diode OLED. A first electrode of the capacitor Cst is connected to the gate electrode of the driving transistor DR, and a second electrode of the capacitor Cst is connected to the anode of the organic light-emitting diode OLED. The anode of the organic light-emitting diode OLED is connected to the second electrode of the driving transistor DR, and the cathode of the organic light-emitting diode OLED is connected to the second power supply line EVSS. A first electrode of the sensing transistor ST is connected to the sensing line VREF, and a second first electrode of the sensing transistor ST is connected to the anode of the organic light-emitting diode OLED and the second electrode of the driving transistor DR.

The operating time of the sensing transistor ST may be similar/identical to the operating time of the switching transistor SW according to an external compensation algorithm (or the configuration of the compensation circuit). For example, the gate electrode of the switching transistor SW may be connected to the first gate line GL1, and the gate electrode of the sensing transistor ST may be connected to the second gate line GL2. In this case, a scan signal Scan is transmitted to the first gate line GL1, and a sensing signal Sense is transmitted to the second gate line GL2. In another example, the first gate line GL1 connected to the gate electrode of the switching transistor SW and the second gate line GL2 connected to the gate electrode of the sensing transistor ST may be connected to be shared.

The sensing line VREF may be connected to the data driver. In this case, the data driver may sense the sensing node of the subpixel in real time, for an image non-display period or for a period of N frames (N being an integer equal to or greater than 1) and generate a sensing result. The switching transistor SW and the sensing transistor ST may be turned on at the same time. In this case, a sensing operation through the sensing line VREF and a data output operation for outputting a data signal are distinguished from each other on the basis of a time division method of the data driver.

A digital data signal, an analog data signal, or a gamma voltage may be compensated according to a sensing result. Also, a compensation circuit that generates a compensation signal (or compensation voltage) based on the sensing result may be implemented within the data driver, within the timing controller, or as a separate circuit.

A light shielding layer LS may be formed only under the channel region of the driving transistor DR, or may be formed under the channel regions of the switching transistor SW and sensing transistor ST, as well as under the channel region of the driving transistor DR. The light shielding layer LS may be used to simply block external light or may be used as an electrode that facilitates a connection to other electrodes or lines and constitutes a capacitor, etc. Therefore, the light shielding layer LS may be composed of multiple layers of metals (multiple layers of different metals) so as to have light shielding properties.

Besides, although FIG. 3 illustrates an example in which each subpixel has a 3T(transistor)1C(capacitor) structure comprising a switching transistor SW, a driving transistor DR, a capacitor Cst, an organic light-emitting diode OLED, and a sensing transistor ST, each pixel may have various alternative structures like 3T2C, 4T2C, 5T1C, 6T2C, etc., for example, if the compensation circuit CC is added to the subpixel.

Referring to FIG. 4, the display panel of the organic light-emitting display comprises a thin-film transistor (TFT) array substrate TSUB, a color filter array substrate CSUB, a display area A/A, and a driving circuit substrate PCB.

The TFT array substrate TSUB comprises a plurality of thin-film transistors and a plurality of organic light-emitting diodes. The color filter array substrate CSUB can comprise red, green, blue, and white color filters and a black matrix defining these color filters. The TFT array substrate TSUB and the color filter array substrate CSUB are held together to form the display panel.

The display area A/A is an image display area, which comprises a plurality of subpixels SP. As described above, the plurality of subpixels SP each comprises thin-film transistors and an organic light-emitting diode to emit light. In some embodiments, the area other than the display area A/A is defined as a bezel area BZ. Gate chip-on films GCOF with a gate driver mounted in them and data chip-on films DCOF with a data driver mounted in them are arranged in the bezel area BZ. In an example, the data chip-on films DCOF are connected to the driving circuit substrate PCB. Thus, signals are applied from the driving circuit substrate PCB to the data and gate chip-on films GCOF and DCOF and transmitted to the subpixels SP in the display area A/A.

Referring to FIG. 5, the organic light-emitting display according to the first exemplary embodiment of the present disclosure is composed of a structure in which the TFT array substrate TSUB and the color filter array substrate CSUB are held together by a sealant SEL.

The TFT array substrate TSUB comprises a plurality of thin-film transistors TFT and organic light-emitting diodes OLED. The subpixels SP each comprise a plurality of thin-film transistors TFT and an organic light-emitting diode OLED. The color filter array substrate CSUB comprises a black matrix BM, a plurality of color filters CF, and an overcoat layer OCL covering the black matrix BM and the color filters CF.

A getter layer GL is situated between the TFT array substrate TSUB and the color filter array substrate CSUB. The getter layer GL comprises a resin layer RL situated between each getter pattern GT. The getter patterns GT are disposed to overlap the aforementioned black matrix BM. An adhesive layer ADL is situated between the getter layer GL and the TFT array substrate TSUB. A more detailed description of the getter layer GL will be described later.

Each element will be described with reference to a cross-sectional structure of the area of the subpixels SP.

Referring to FIG. 6 the organic light-emitting display according to the first exemplary embodiment is composed of a structure in which the TFT array substrate TSUB and the color filter array substrate CSUB are held together. In the TFT array substrate TSUB, a buffer layer BUF lies on a first substrate SUB1. The first substrate SUB1 is made of glass, plastic, or metal. The buffer layer BUF serves to protect thin-film transistors formed in a subsequent process from impurities such as alkali ions leaking out of the first substrate SUB1. The buffer layer BUF may be a silicon oxide (SiOx), a silicon nitride (SiNx), or multiple layers of these compounds.

A semiconductor layer ACT lies on the buffer layer BUF. The semiconductor layer ACT may be made of silicon semiconductor or oxide semiconductor. The silicon semiconductor may comprise amorphous silicon or crystallized polycrystalline polysilicon. The polycrystalline silicon has a high mobility (for example, more than 100 cm$^2$/Vs), low power consumption, and excellent reliability. Thus, the polycrystalline silicon can be applied to a gate driver for a driving element and/or a multiplexer (MUX) or applied to a driving TFT in a pixel. Because the oxide semiconductor has a low OFF-current, the oxide semiconductor is suitable for a switching TFT which has a short ON-time and a long OFF-time. Further, because the oxide semiconductor can increase a voltage hold time of the pixel due to the low OFF-current, the oxide semiconductor is suitable for a display device requiring low-speed operation and/or low power consumption. In addition, the semiconductor layer ACT comprises a drain region and a source region each including p-type or n-type impurities, and also comprises a channel between the drain region and the source region. The semiconductor layer ACT may further comprise a low-doped region between the drain and source regions adjacent to the channel.

A gate insulating film GI lies on the semiconductor layer ACT. The gate insulating film GI may be silicon oxide SiOx, silicon nitride SiNx, or multiple layers of these compounds. A gate electrode GAT lies on the gate insulating film GI, corresponding to a channel of the semiconductor layer ACT for injecting an impurity. The gate electrode GAT acts as a gate electrode of the driving transistor. The gate electrode GAT may be made up of any one selected from the group consisting of molybdenum (Mo), aluminum (Al), chrome (Cr), gold (Au), titanium (Ti), nickel (Ni), neodymium (Nd), and copper (Cu) or multiple layers of alloys of these elements. Further, the gate electrode GAT may be a multi-layer formed of one of molybdenum (Mo), aluminum (Al), chrome (Cr), gold (Au), titanium (Ti), nickel (Ni), neodymium (Nd), copper (Cu), or alloys of these elements. For example, the gate electrode GAT may consist of dual layers of molybdenum/aluminum-neodymium or molybdenum/aluminum.

An interlayer insulating film ILD for insulating the gate electrode GAT lies on the gate electrode GAT. The interlayer insulating film ILD may be a silicon oxide film (SiOx), a silicon nitride film (SiNx), or multiple layers of these compounds. Contact holes CH exposing part of the semiconductor layer ACT are located in some regions of the interlayer insulating film ILD. A drain electrode DE and a source electrode SE lie on the interlayer insulating film ILD. The source electrode SE and the drain electrode DE are connected to the semiconductor layer ACT via the contact holes CH.

The source electrode SE and the drain electrode DE may consist of a single layer or multiple layers. If the source electrode SE and the drain electrode DE consist of a single layer, they may be made up of any one selected from the group consisting of molybdenum (Mo), aluminum (Al), chrome (Cr), gold (Au), titanium (Ti), nickel (Ni), neodymium (Nd), and copper (Cu), or an alloy of these elements. On the other hand, if the source electrode SE and the drain electrode DE consist of multiple layers, they may be made up of two layers of molybdenum/aluminum-neodymium or three layers of titanium/aluminum/titanium, molybdenum/aluminum/molybdenum, or molybdenum/aluminum-neodymium/molybdenum. As such, a thin film transistor TFT comprising the semiconductor layer ACT, the gate electrode GA, the drain electrode DE, and the source electrode SE is formed.

A planarization layer OC lies on the first substrate SUB1 comprising the thin-film transistor TFT. The planarization layer OC is used for smoothing out irregularities on the underlying structure, and is made of an organic material such as polyimide, benzocyclobutene-based resin, acrylate, etc.

A via hole VIA exposing the source electrode SE is located in some region of the planarization layer OC. A first electrode ANO lies on the planarization layer OC. The first electrode ANO may act as a pixel electrode and is connected to the source electrode SE of the thin-film transistor TFT via the via hole VIA. The first electrode ANO is an anode, and may be made of a transparent conductive material, for example, ITO (indium tin oxide), IZO (indium zinc oxide), or ZnO (zinc oxide). If the first electrode ANO is a reflective electrode, the first electrode ANO may further comprise a reflective layer. The reflective layer may be made of aluminum (Al), copper (Cu), silver (Ag), nickel (Ni), or an alloy of these elements, for example, APC (silver/palladium/copper alloy).

In some embodiments, a bank layer BNK for defining a pixel lies on the first substrate SUB1 comprising the first electrode ANO. The bank layer BNK is made of an organic material such as polyimide, benzocyclobutene-based resin, acrylate, etc. The bank layer BNK has an open portion OP exposing the first electrode ANO. An emission layer EML making contact with the first electrode ANO is located in the open portion OP. The emission layer EML is a layer that emits light by the recombination of electrons and holes. A hole injection layer or hole transport layer may be formed between the emission layer EML and the first electrode ANO, and an electron transport layer or electron injection layer may be formed on the emission layer EML.

A second electrode CAT lies on the emission layer EML. The second electrode CAT is located on the entire surface of the display area A/A and is a cathode, which may be made of magnesium (Mg), calcium (Ca), aluminum (Al), silver (Ag), or an alloy thereof that has a low work function. If the second electrode CAT is a transmissive electrode, it may be made thin enough to pass light through. If the second electrode CAT is a reflective electrode, it may be made thick enough to reflect light. Although not shown, a passivation film may lie on the second electrode CAT. Thus, the TFT array substrate TSUB is configured.

The TFT array substrate TSUB is bonded to the color filter array substrate CSUB through the adhesive layer ADL. In the color filter array substrate CSUB, a black matrix BM is located on one surface of a second substrate SUB2. The second substrate SUB2 is made of glass, plastic, or metal, and the second substrate SUB2 may be made of transparent glass or plastic through which light can pass. The black matrix BM is used for shielding the light emitted from other regions than the subpixels SP. The black matrix BM contains a light-absorbing material—for example, carbon black. Color filters can be arranged in the regions defined by the black matrix BM. The color filters CF convert white light emitted from the emission layer EML into red, green, and blue light, and comprise red color filters R, green color filters G, and blue color filters (not shown). The white light emitted from the emission layer EML passes through the regions where there are no color filters CF, thereby producing white light. Therefore, the organic light-emitting display may have a total of four subpixels of red, green, blue, and white. However, the present disclosure is not limited to this, and the subpixels may be provided in three colors but not in white. An overcoat layer OCL for protecting the color filters CF and the black matrix BM lies on one surface of the color filters CF and black matrix BM to configure the color filter array substrate CSUB. The TFT array substrate TSUB and the color filter array substrate CSUB are held together through the adhesive layer ADL.

A getter layer GL is situated between the TFT array substrate TSBU and the color filter array substrate CSUB. The getter layer GL is used for absorbing moisture produced in the display device, and comprises a getter patter GT comprising a getter.

More specifically, the getter layer GL according to an exemplary embodiment of the present disclosure may comprise a getter pattern GT and a resin layer RL surrounding the getter pattern GT.

The getter pattern GT is formed of a getter composition containing a getter, a binder, and a solvent. The getter is a material that can absorb moisture—for example, one selected from the group consisting of calcium oxide, magnesium oxide, strontium oxide, aluminum oxide, barium oxide, calcium chloride, potassium carbonate, potassium hydroxide, sodium hydroxide, lithium hydroxide, lithium sulfate, sodium sulfate, calcium sulfate, magnesium sulfate, cobalt sulfate, gallium sulfate, titanium sulfate, nickel sulfate, phosphorus pentoxide, and mixtures thereof.

The binder is used for fixing the getter and adjusting the viscosity of the composition, and may be one selected from the group consisting of acrylic resin, polyimide resin, phenol resin, cardo resin, and ethylcellulose resin. Additionally, these resins may be compounds containing an acid group or epoxy group.

The solvent may be used for dispersing the above-mentioned getter and binder and adjusting the viscosity of the composition. The solvent may be one selected from the group consisting of: water; alcohols such as ethanol, methanol, isopropyl alcohol, butanol, 2-ethylhexyl alcohol, methoxy pentanol, butoxy ethanol, ethoxyethoxy ethanol, butoxyethoxy ethanol, methoxypropoxy propanol, texanol, and terpineol (e.g., α-terpineol); tetrahydrofuran (THF); glycerol; alkylene glycol such as ethylene glycol, triethylene glycol, polyethylene glycol, propylene glycol, dipropylene glycol, dihexylene glycol, or alkyl ethers thereof (e.g., propylene glycol methyl ether (PGME), diethylene glycol butyl ether, diethylene glycol ethyl ether, and dipropylene glycol methyl ether, dihexylene glycol ethyl ether); glycerin, N-methyl-2-pyrrolidinone (NMP), 2-pyrrolidone, acetylacetone, 1,3-dimethylimidazolinone, thiodiglycol, dimethyl sulfoxide (DMSO), N,N-dimethyl acetamide (DMAc), dimethylformamide (DMF)), sulfolane, diethanolamine, and triethanolamine, and ketones such as methyl ethyl ketone and cyclopentanone; aromatic compounds such as xylene, toluene, and benzene; ethers such as dipropylene methyl ether; and aliphatic hydrocarbons such as methylene chloride and chloroform, or at least two thereof may be used in combination.

The resin layer RL surrounding the getter pattern GT may be made of a photoresist which becomes insoluble or soluble to a specific solution when exposed to light. The getter pattern GT appears to fill holes RCH formed in the resin layer RL.

The getter layer GL comprising the aforementioned getter pattern GT and resin layer RL may be formed as follows. A photoresist is applied onto the color filter array substrate CSUB where the color filters CF, black matrix BM, and overcoat layer OCL are formed, and holes RCH are formed in regions overlapping the black matrix BM to form the resin layer RL. For example, if the photoresist is negative type, the holes RCH may be formed by exposing the photoresist to light in the regions that overlap the black matrix BM and developing it. Contrariwise, if the photoresist is positive type, the holes RCH may be formed by exposing the photoresist to light in the regions other than the regions overlapping the black matrix BM and developing it. The getter pattern GT is formed in the holes RCH of the resin layer RL by applying the getter composition onto the resin layer RL by squeezing. Accordingly, the getter layer GL may be formed on the color filter array substrate CSUB. On the contrary, as shown in FIG. 7, the getter pattern GT may be formed by forming grooves RGR, instead of the holes, in the resin layer RL and filling the getter composition in the grooves RGR.

The getter layer GL may be 1 to 100 μm thick. If the getter layer GL is 1 μm thick or greater, the quantity of the getter may be increased and absorb moisture produced in the display device. If the getter layer GL is 100 μm or less, holes or grooves may be formed easily in the resin layer RL even though the width of the getter pattern GT is limited.

If the getter of the aforementioned getter layer GL is opaque, it cannot be formed on a path through which light is sent out, and, even if it is transparent, decreases transmission. Thus, the getter pattern GT of the present disclosure is disposed to overlap the black matrix BM.

Figure 8:
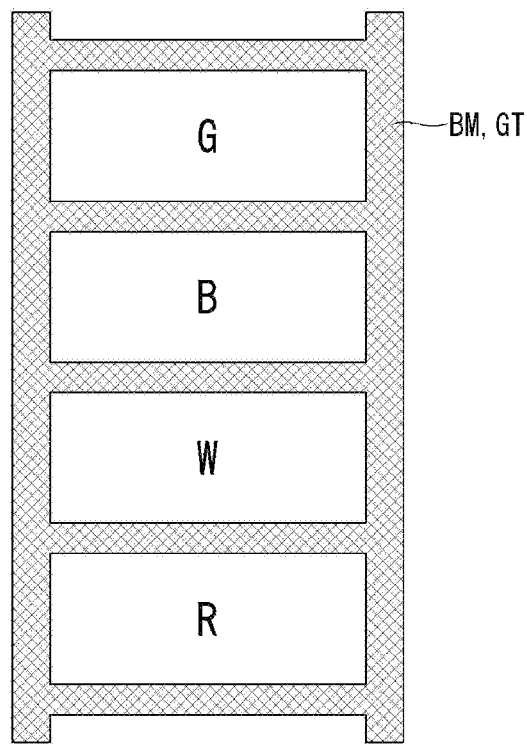
FIGS. 8 and 9 are top plan views of a part of the organic light-emitting display according to the first exemplary embodiment.
Figure 9:
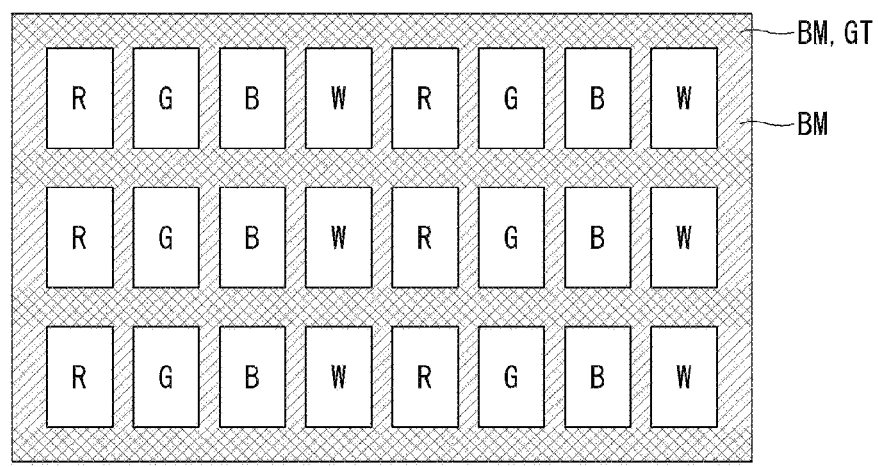

FIGS. 8 and 9 are top plan views of a part of the organic light-emitting display according to the first exemplary embodiment. The organic light-emitting display of FIG. 5 may be depicted as in FIGS. 8 and 9 when viewed from above.

The black matrix BM can be defined by R, G, B, and W subpixels, and light from each subpixel is not emitted but absorbed by the black matrix BM in the region where the black matrix BM is placed. For example, the black matrix BM has the shape of meshes that define the subpixels. The getter pattern GT of the present disclosure has the same shape as the black matrix BM while overlapping it. That is, the getter pattern GT has such a shape in which R, G, B, and W subpixels can be defined. For example, the getter pattern GT may be in the shape of meshes. Accordingly, the getter pattern GT is not located on the path of light emitted from the subpixels, whereby the aperture ratio is not affected.

As shown in FIG. 9, the black matrix BM is in the shape of meshes that can define the subpixels, while the getter pattern GT may be in the shape of stripes. The getter pattern GT of the present disclosure may have any shape as long as the aperture ratio is not decreased when it overlaps the black matrix BM.

In the organic light-emitting display device according to the present disclosure, the adhesive layer ADL is formed between the color filter array substrate CSUB and TFT array substrate TSUB where the getter layer GL is formed, thereby joining these substrates together. As shown in FIG. 5, a sealant SEL is formed on the edges of the color filter array substrates CSUB and TFT array substrate TSUB, thereby joining these substrates together. In particular, the aforementioned getter is contained in the sealant SEL so that it can absorb moisture permeating from the outside.

As described above, the organic light-emitting display device according to an exemplary embodiment of the present disclosure may absorb moisture produced in it, without affecting the aperture ration, by forming a getter pattern in it in such a manner as to overlap the black matrix. Accordingly, the reliability of the organic light-emitting display may be improved.

The organic light-emitting display of the present disclosure may have various structures depending on the manufacturing method of the getter layer.

Figure 10:
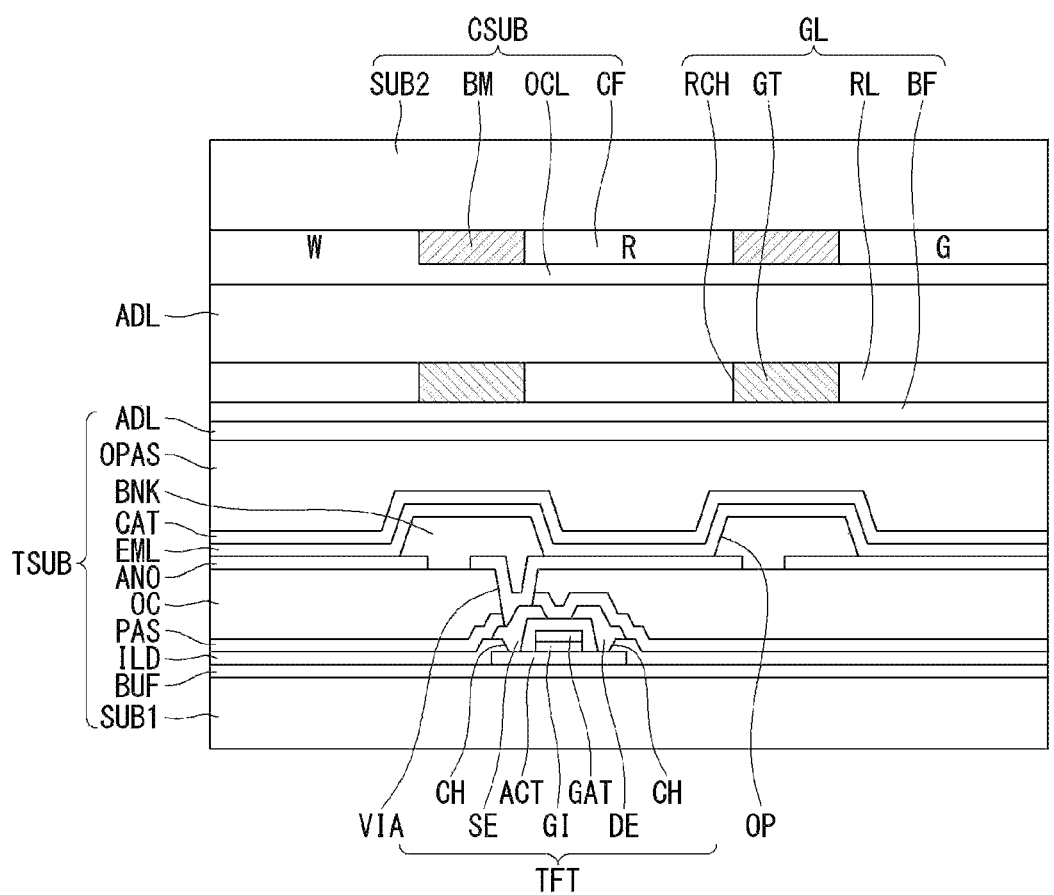
FIGS. 10 and 11 are cross-sectional views of an organic light-emitting display according to a second exemplary embodiment.
Figure 11:
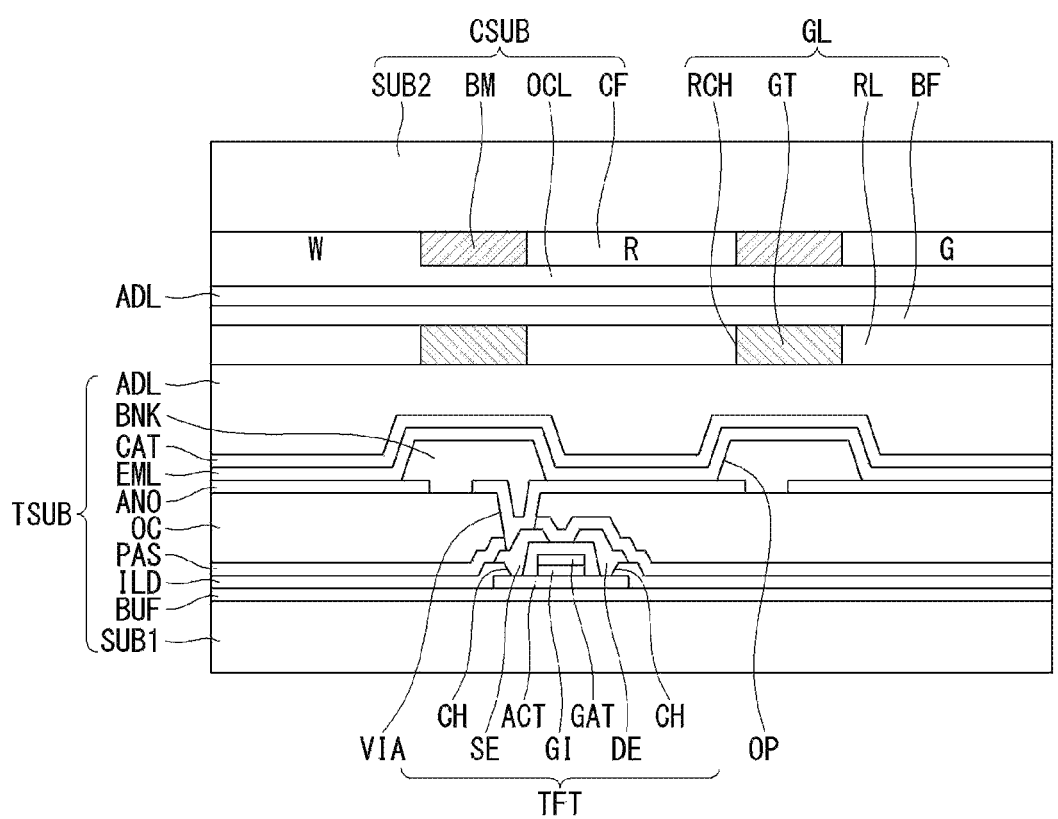
Figure 12:
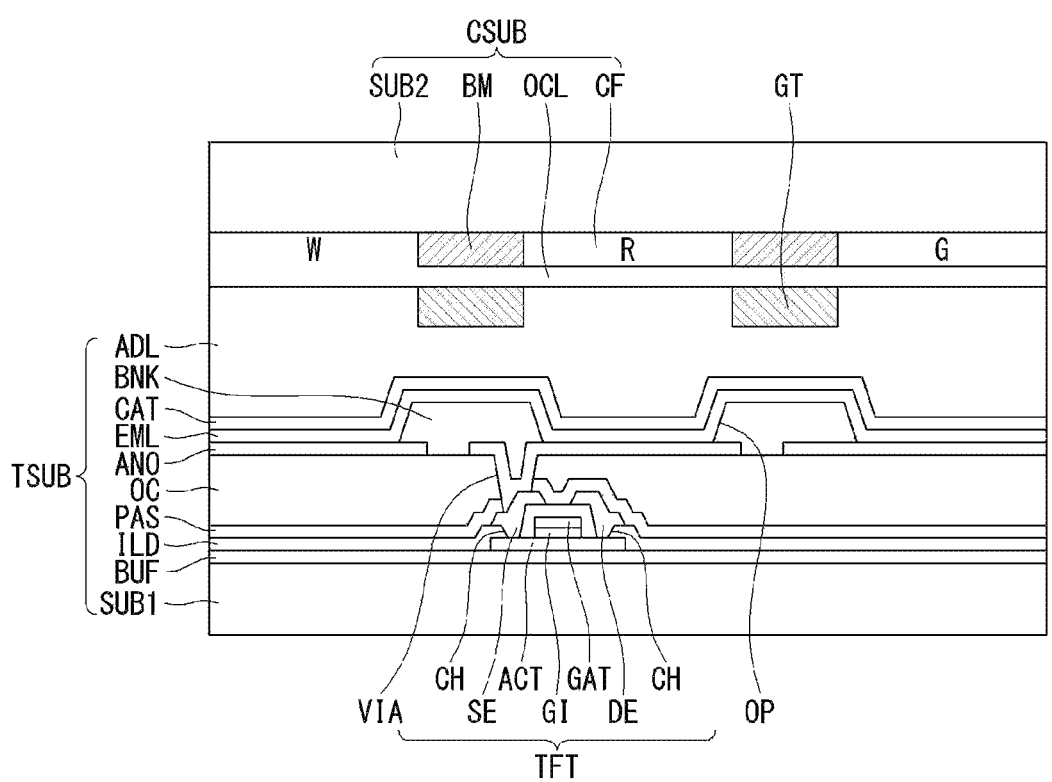
FIGS. 12 and 13 are cross-sectional views of an organic light-emitting display according to a third exemplary embodiment.
Figure 13:
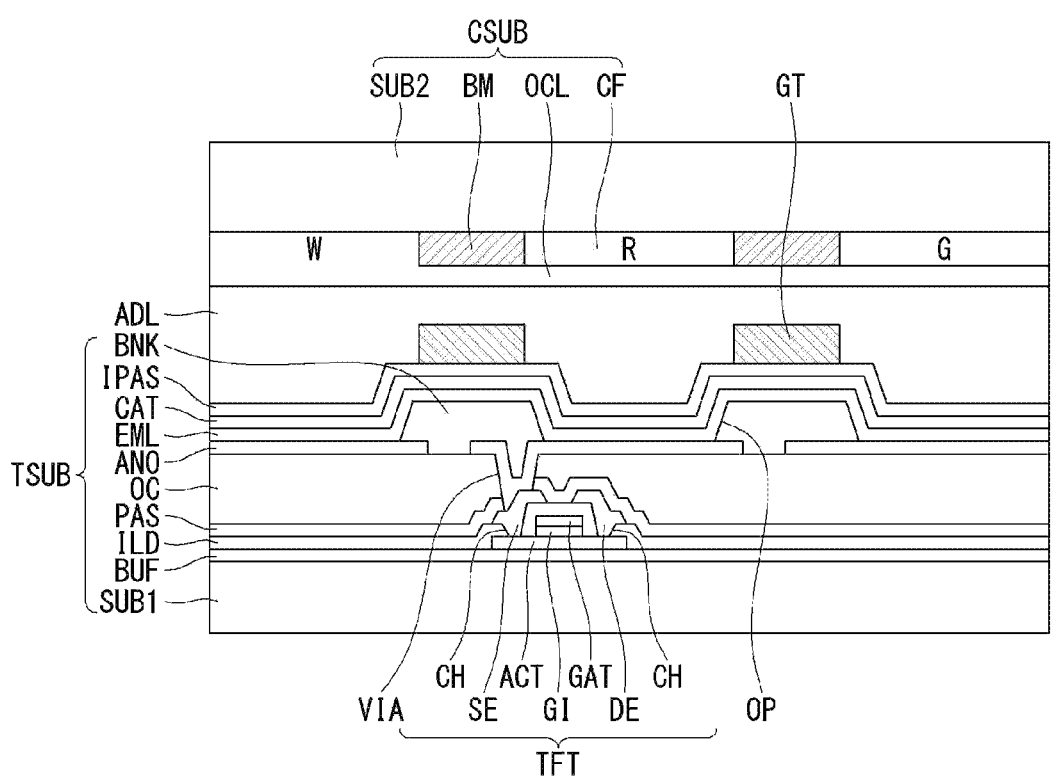

FIGS. 10 and 11 are cross-sectional views of an organic light-emitting display according to a second exemplary embodiment. FIGS. 12 and 13 are cross-sectional views of an organic light-emitting display according to a third exemplary embodiment. In what follows, the same components as the above-described exemplary embodiment will be denoted by the same reference numerals, and a description of them will be omitted.

Referring to FIG. 10, in the organic light-emitting display according to the second exemplary embodiment, a getter layer GL is situated between the TFT array substrate TSBU and the color filter array substrate CSUB. The getter layer GL is used for absorbing moisture produced in the display device, and comprises a getter patter GT comprising a getter.

More specifically, the getter layer GL according to the present disclosure may be a type of film that comprises a base film BF and a getter pattern GT and resin layer RL that lie over the base film BF.

The getter pattern GT and the resin layer RL lie over the base film BF. The base film BF is a transparent support film that may be made of a well-known material such as polycarbonate (PC), polyethylene terephthalate (PET), polypropylene (PP), and polyethylene (PE). The resin layer RL overlying the base film BF has holes RCH formed in the resin layer RL, and a getter composition fills the holes RCH to form the getter pattern GT.

The organic light-emitting display comprising the aforementioned film-type getter layer GL may be manufactured as follows. A photoresist is applied onto a base film BF and exposed to light and developed to form holes RCH, thereby forming a resin layer RL. A getter composition is applied onto the resin layer RL by squeezing to form a getter pattern GT. The film-type getter layer GL thus made is bonded onto a TFT array substrate through an adhesive layer ADL. Then, the color filter array substrate CSUB and the TFT array substrate TSUB are held together through the adhesive layer ADL, thereby manufacturing an organic light-emitting display.

On the other hand, as shown in FIG. 11, an organic light-emitting display may be manufactured by bonding the film-type getter layer GL onto the color filter array substrate CSUB through the adhesive layer ADL and then joining the TFT array substrate TSUB and the color filter array substrate CSUB. The aforementioned film-type getter layer GL shown in FIGS. 10 and 11 may be made in any way as long as the substrates are held together in such a manner that the getter pattern Gt overlaps the black matrix BM.

As described above, the organic light-emitting display according to the second exemplary embodiment of the present disclosure may improve productivity by facilitating the process since a getter layer is formed as a film type.

Referring to FIG. 12, an organic light-emitting display according to the third exemplary embodiment of the present disclosure has a getter pattern GT situated between the TFT array substrate TSBU and the color filter array substrate CSUB. The getter pattern GT is used for absorbing moisture produced in the display device, and comprises a getter for absorbing moisture.

Unlike the getter layers in the first and second exemplary embodiments, the getter layer according to the third exemplary embodiment of the present disclosure is composed solely of a getter pattern GT. The getter pattern GT lies on the overcoat layer OCL of the color filter array substrate CSUB and overlaps the black matrix BM.

The aforementioned getter pattern GT may be made as follows. A getter composition is printed onto the color filter array substrate CSUB where the overcoat layer OCL is formed, by using a nozzle printing machine. In this case, the getter pattern GT is formed by printing the getter composition in such a manner as to overlap the black matrix BM. The color filter array substrate CSUB thus made is bonded to the TFT array substrate TSUB through an adhesive layer ADL, thereby manufacturing an organic light-emitting display.

On the other hand, as shown in FIG. 13, an organic light-emitting display may be manufactured by printing the getter pattern GT onto the TFT array substrate TSUB where an inorganic passivation film IPAS is formed and then bonding it to the color filter array substrate CSUB through the adhesive layer ADL. The aforementioned getter pattern GT shown in FIGS. 12 and 13 may be made in any way as long as the substrates are held together in such a manner that the getter pattern GT overlaps the black matrix BM.

As described above, the organic light-emitting display according to the third exemplary embodiment of the present disclosure may improve productivity by simplifying the structure and facilitating the process since a getter pattern is formed by a printing method.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings, and the appended claims. In addition to variations and modifications in the component parts and/or arrangements, alternative uses will also be apparent to those skilled in the art.

What is claimed is:

1. A display device comprising:
a thin-film transistor (TFT) array substrate where organic light-emitting diodes are formed;
a color filter array substrate that faces the TFT array substrate and comprises a black matrix; and
a getter layer that is situated between the TFT array substrate and the color filter array substrate and comprises a getter pattern overlapping the black matrix,
wherein the getter pattern is in a shape of meshes or in a shape of stripes.

2. The display device of claim 1, wherein the getter layer comprises a base film, and the getter pattern lies over the base film.

3. The display device of claim 2, wherein the getter layer comprises a resin layer that is disposed on the base film and has holes or grooves.

4. The display device of claim 1, wherein the getter layer comprises a resin layer that disposed on the color filter array substrate and has holes or grooves.

5. The display device of claim 3, wherein the getter pattern fills the holes or grooves.

6. The display device of claim 1, further comprising an adhesive layer disposed between the getter layer and the color filter array substrate.

7. The display device of claim 1, wherein the getter pattern has a same shape as the black matrix.

8. The display device of claim 1, wherein a thickness of the getter layer is 1 to 100 μm.

9. The display device of claim 1, further comprising a sealant for bonding the color filter array substrate and the TFT array substrate together, wherein the sealant comprises the getter.

10. A display device comprising:
a thin-film transistor (TFT) array substrate where organic light-emitting diodes are formed;
a color filter array substrate that faces the TFT array substrate and comprises a black matrix; and
a getter pattern that is disposed between the TFT array substrate and the color filter array substrate and overlaps the black matrix,
wherein the getter pattern has a same shape as the black matrix.

11. The display device of claim 10, wherein a thickness of the getter pattern is 1 to 100 μm.

* * * * *